(12) United States Patent
Yusof et al.

(10) Patent No.: US 7,901,988 B2
(45) Date of Patent: Mar. 8, 2011

(54) METHOD FOR FORMING A PACKAGE-ON-PACKAGE STRUCTURE

(75) Inventors: Asri bin Yusof, Singapore (SG); Vincent Ho, Singapore (SG)

(73) Assignee: EEMS Asia Pte Ltd, Singapore (SG)

( * ) Notice: Subject to any disclaimer, the term of this patent is extended or adjusted under 35 U.S.C. 154(b) by 169 days.

(21) Appl. No.: 12/188,866

(22) Filed: Aug. 8, 2008

(65) Prior Publication Data

US 2010/0032847 A1 Feb. 11, 2010

(51) Int. Cl.
*H01L 21/44* (2006.01)
(52) U.S. Cl. .. 438/109; 438/118; 438/127; 438/E21.504; 438/E23.039; 257/686; 257/787
(58) Field of Classification Search .......... 438/106–118, 438/124–127; 257/678–686, 777–787
See application file for complete search history.

(56) References Cited

U.S. PATENT DOCUMENTS

| 2007/0290376 | A1* | 12/2007 | Zhao et al. ............ 257/787 |
| 2008/0076208 | A1* | 3/2008 | Wu et al. ............ 438/109 |
| 2008/0099904 | A1* | 5/2008 | Chou et al. ............ 257/686 |
| 2008/0182363 | A1* | 7/2008 | Amrine et al. ............ 438/118 |

* cited by examiner

*Primary Examiner* — Dung A. Le
(74) *Attorney, Agent, or Firm* — McDonnell Boehnen Hulbert & Berghoff LLP

(57) ABSTRACT

A method for forming a package-on-package structure is disclosed. The method comprises the step of providing a first semiconductor package. The first semiconductor package has at least one encapsulation layer formed on at least one side of the first semiconductor package. The method also involves the step of securing the first semiconductor package to a surface. The surface is adapted for receiving the first semiconductor package. The method further involves the step of reducing the thickness of the at least one encapsulation layer to a predetermined thickness. The at least one encapsulation layer having a portion distal the surface removed. More specifically, the thickness of the at least one encapsulation layer is reduced for providing a predetermined clearance from a second semiconductor package attachable to the first semiconductor package. The clearance is the distance between the at least one encapsulation layer of the first semiconductor package and a side of the second semiconductor package opposing thereto.

17 Claims, 5 Drawing Sheets

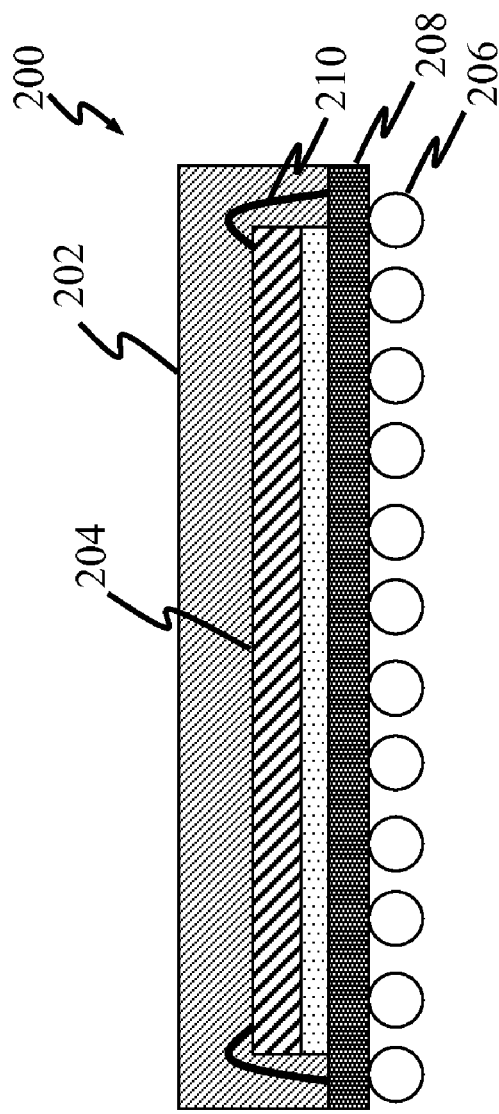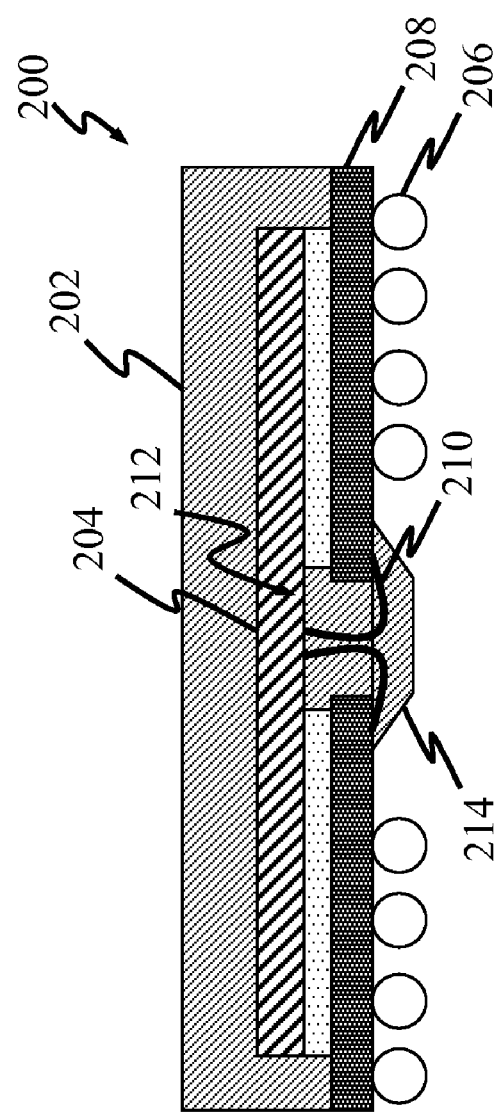

METHOD FOR FORMING A PACKAGE-ON-PACKAGE STRUCTURE

FIELD OF INVENTION

The invention relates generally to a method for forming package-on-package structures. In particular, the invention relates to a method for reducing the profile of semiconductor devices for forming package-on-package structures.

BACKGROUND

Digital gadgets such as computers and mobile phones have become increasingly faster in processing speed and yield better operating performance. Packaging technology for integrated circuit (IC) packaging has correspondingly evolved from a single package configuration to a package-on-package (POP) configuration. The POP configuration involves stacking two or more packages together to form a multiple package structure.

An IC package is fabricated with an overmold for encapsulating an IC chip within the IC package. Specifically, the overmold of IC packages in the POP configuration is comparatively thinner than the overmold of IC packages in the single package configuration. This is to provide sufficient clearance or space between the two or more IC packages that are stacked together in the POP configuration.

Conventional methods for fabricating the overmold of packages in the POP configuration involve the use of specific epoxy molding compound and complex molding techniques to achieve low profile compliant overmold. However, the conventional methods require a complex design of mold toolings and high cost of fabrication due to the use of specially formulated epoxy mold compound. This results in undesirable limitations in the conventional methods for large-scale industrial applications.

Accordingly there is a need for processing overmold of packages in the POP configuration using common fabrication process and materials for large-scale industrial applications.

SUMMARY

Embodiments of the invention disclosed herein provide a method for processing overmold of a semiconductor package for forming a package-on-package structure using common fabrication process and materials for large-scale industrial applications.

According to a first embodiment of the invention, the method for forming a package-on-package structure is disclosed. The method comprises the step of providing a first semiconductor package. The first semiconductor package has at least one encapsulation layer formed on at least one side of the first semiconductor package. The method also involves the step of securing the first semiconductor package to a surface. The surface is adapted for receiving the first semiconductor package. The method further involves the step of reducing the thickness of the at least one encapsulation layer to a predetermined thickness. The at least one encapsulation layer having a portion distal the surface removed. More specifically, the thickness of the at least one encapsulation layer is reduced for providing a predetermined clearance from a second semiconductor package attachable to the first semiconductor package. The clearance is the distance between the at least one encapsulation layer of the first semiconductor package and a side of the second semiconductor package opposing thereto.

According to a second embodiment of the invention, a package-on-package structure is disclosed. A package-on-package structure comprises a first semiconductor package having at least one encapsulation layer formed on at least one side of the first semiconductor package. The at least one encapsulation layer has a portion distal the at least one encapsulation layer removed. The package-on-package structure further comprises a second semiconductor package having connectors for coupling to the first semiconductor package to form the package-on-package structure, the height of the at least one encapsulation layer being less than the height of the connectors. More specifically, the at least one encapsulation layer of the first semiconductor package has a process surface while the thickness of the at least one encapsulation layer is reduced to a predetermined thickness for providing a predetermined clearance from the second semiconductor package, the clearance being the distance between the process surface and a side of the second semiconductor package opposing thereto.

BRIEF DESCRIPTION OF THE DRAWINGS

Embodiments of the invention are described hereinafter with reference to the drawings, in which:

FIGS. 2a and 2b are cross-sectional views of a ball grid array (BGA) package and a face down ball grid array (FD-BGA) package respectively;

DETAILED DESCRIPTION

Figure 1:
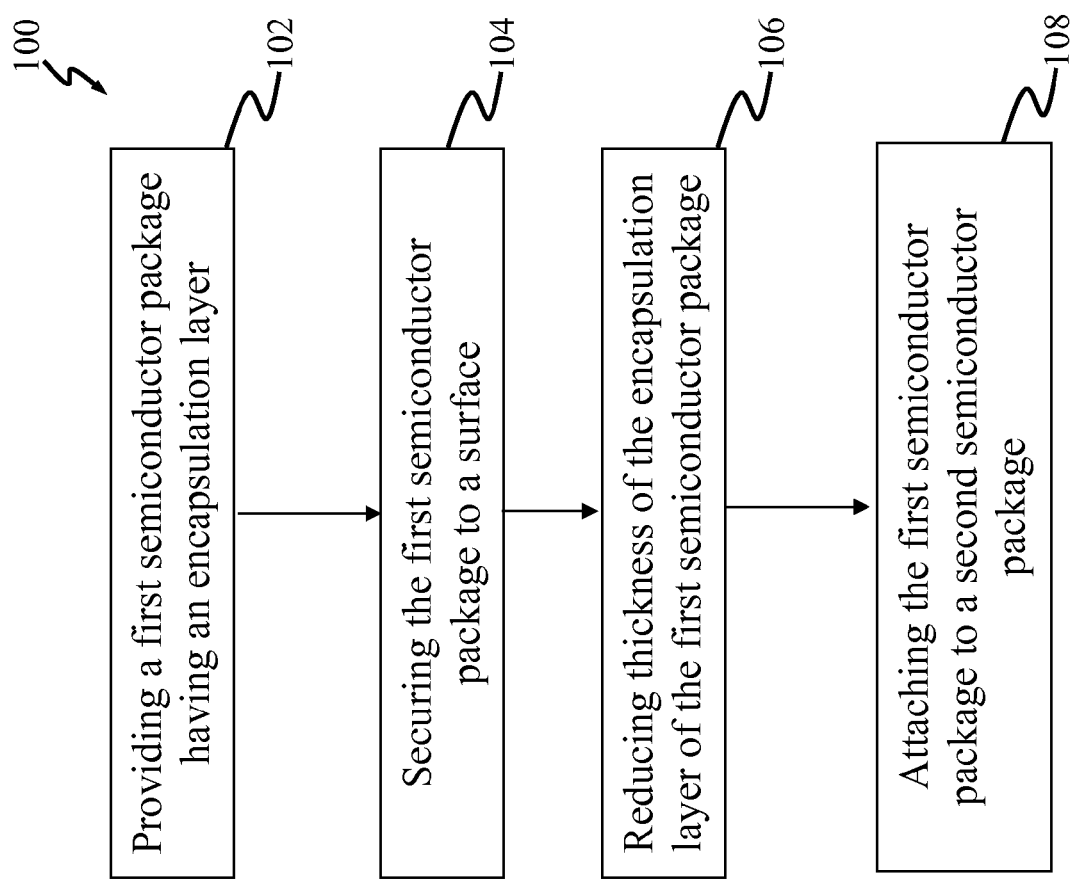
FIG. 1 is a flow diagram showing a method for forming a package-on-package (POP) structure according to an embodiment of the invention.

With reference to the drawings, a method according to embodiments of the invention for processing overmold of semiconductor packages in a Package-On-Package configuration is disclosed. The method advantageously uses common fabrication process and materials for large-scale industrial applications.

Various fabrication methods for overmold processing of semiconductor packages in a POP configuration have been previously proposed. These conventional methods for overmold processing require a complex design of mold toolings and high cost of fabrication due to the use of specially formulated epoxy mold compound. This results in undesirable limitations in the conventional methods for large-scale industrial applications.

For purposes of brevity and clarity, the description of the invention is limited hereinafter to fine pitch ball grid array (FBGA) applications. This however does not preclude embodiments of the invention from other applications that require similar operating performance as the FBGA applications. The functional principles fundamental to the embodiments of the invention remain the same throughout the variations.

In the detailed description provided hereinafter and FIG. 1 to FIG. 5b of the drawings, like elements are identified with like reference numerals.

A preferred embodiment of the invention is described in greater detail hereinafter for a method for processing overmold semiconductor packages to form a package-on-package (POP) structure.

FIG. 1 is a flow diagram showing a method 100 for forming a POP structure. The method 100 comprises a step 102 of providing a first pre-processed semiconductor package that has an encapsulation layer. For purposes of brevity and of clarity, pre-processed semiconductor package is hereinafter called semiconductor package. The method 100 also involves a step 104 of securing the first semiconductor package to a surface as well as a step 106 of reducing thickness of the encapsulation layer. The method 100 further involves a step 108 of attaching the first semiconductor package to a second semiconductor package.

An overmould comprises an encapsulation layer is formed on one or more sides of the first semiconductor package. The encapsulation layer encloses and protects an integrated circuit chip or silicon die and bonding wires within the first semiconductor package. The silicon die has an active side that is connectable to an external circuitry.

An example of the first semiconductor package 200 is a ball grid array (BGA) package. FIG. 2a shows a cross-sectional view of the BGA package. One side of the BGA package has an encapsulated layer 202 for enclosing a silicon die 204 while a plurality of connectors such as solder balls 206 is attached to the other side of the BGA package. The silicon die 204 is placed on a substrate 208 and is connected to the substrate 208 by bonding wires 210.

Another example of the first semiconductor package 200 is a face down ball grid array (FDBGA) package as shown in FIG. 2b. The main difference between the FDBGA package and the BGA package is that the active side of the silicon die 204 is facing away from the substrate 208 of the BGA package while the active side of the silicon die 204 is facing towards the substrate 208 of the FDBGA package. An opening 212 is made in the substrate 208 of the FDBGA package for connecting the silicon die 204 to the substrate 208 via bonding wires 210.

Another encapsulation layer, known hereinafter as a mold cap 214, is formed over the opening 212 for covering the opening 212 and for enclosing and protecting the bonding wires 210.

In the foregoing examples, the encapsulation layer 202 and the mold cap 214 are made of epoxy molding compound (EMC) or other suitable encapsulants for silicon die or bonding wire protection.

With reference to FIGS. 3a to 3e, the first semiconductor package 200 is secured to a surface 302 of a support or chuck table 300 for subsequent processing. A plurality of the first semiconductor packages 200 is formed on a substrate panel 304. A full panel substrate typically includes several substrate panels that consist of individual semiconductor packages. Grooves or notches (not shown) are preferably formed in between the substrate panels 304 to facilitate the separation of the substrate panels 304. The grooves provide identification of cut lines for separating individual substrate panels 304 and are formed on one or opposing sides of the substrate panels 304. The grooves are preferably of flat trench or v-shape type.

The grooves provide a weakened line on the full panel substrate, which allow the substrate panels 304 to be separated with the use of a cutter. Alternatively, the full panel substrate is broken along the weakened line, without the need of any cutting action, for separating individual substrate panels 304. This advantageously simplified and improved on the efficiency of separating the individual substrate panels 304 on the full panel substrate.

The support table 300 is preferably capable of accommodating and securing a full panel substrate, individual substrate panels or semiconductor packages.

Figure 3A:
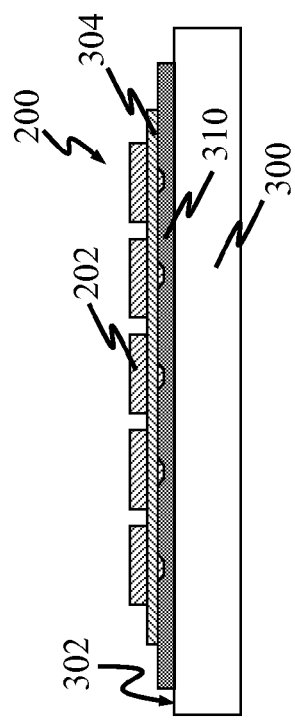
FIGS. 3a to 3e show different ways in which a semiconductor package is secured to a support table for subsequent processing.

In a first example, a mechanical holder 306, such as a set of jig and fixture, secures the first semiconductor package 200 to the surface 302 of the support table 300. The mechanical holder 306 has a pair of grippers 308 for gripping the substrate panel 304 as shown in FIG. 3a. The pair of grippers 308 preferably clamps the substrate panel 304 onto the surface 302.

Figure 3B:
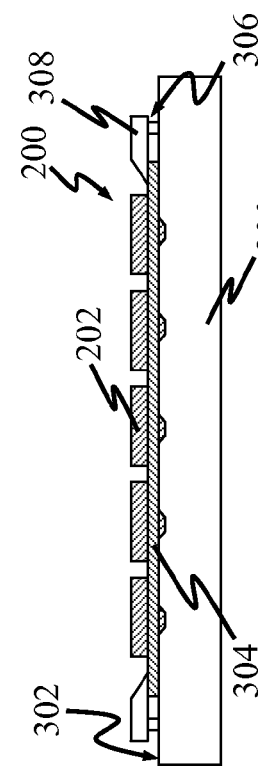

In a second example, a lamination tape 310 is used to secure the first semiconductor package 200 to the surface 302 of the support table 300, as shown in FIG. 3b. This is achieved by attaching the substrate panel 304 to the lamination tape 310. One side of the lamination tape 310 is adhered to the substrate panel 304 and follows the contour thereof. The first semiconductor package 200 is secured to the surface 302 by the adhesion between the substrate panel 304 and the lamination tape 310 as well as the adhesion between the lamination tape 310 and the surface 302.

Figure 3C:
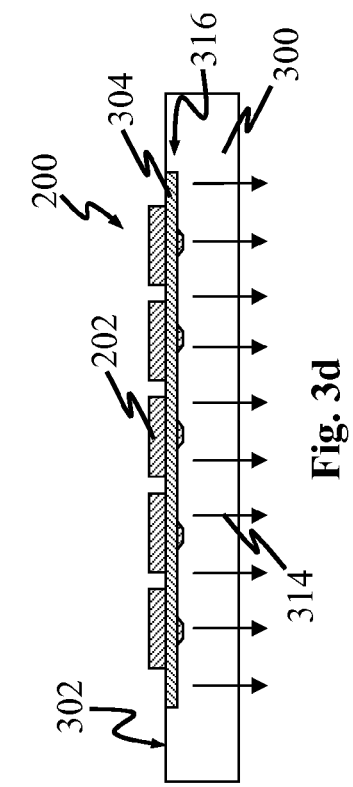

Alternatively, another lamination tape 312 is sandwiched between the foregoing lamination tape 310 and the surface 302 of the support table 300 for improving the securing of the first semiconductor package 200 to the surface 302, as shown in FIG. 3c. The lamination tapes 310, 312 are mounted onto the support table 300 with or without a securing ring (not shown). Additionally, the lamination tapes 310, 312 are mounted onto the support table 300 at room temperature or preferably at an elevated temperature of not more than 100° C. so as to soften the lamination tapes to allow the lamination tapes 310, 312 to better follow the contour of the substrate panel 304.

Figure 3D:
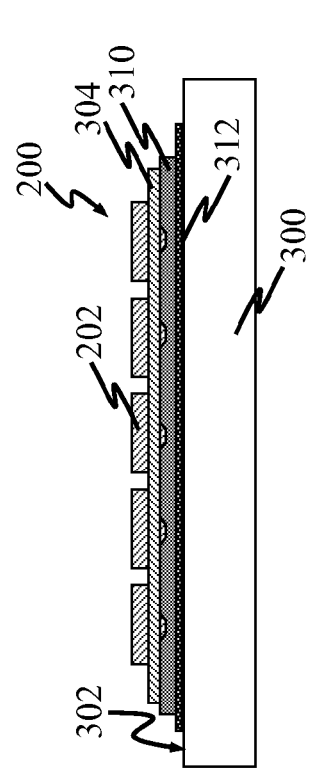

In a third example, the first semiconductor package 200 is secured to the surface 302 of the support table 300 by vacuum suction 314, as shown in FIG. 3d. In this example, the surface 302 has a recess 316 for receiving the substrate panel 304 on which the plurality of first semiconductor packages 200 is formed. Additionally, the support table 300 consists of a porous block that is connected to a vacuum pump (not shown). In particular, vacuum suction is applied via the porous block to the substrate panel 304 that is in contact with the surface 302.

Figure 3E:
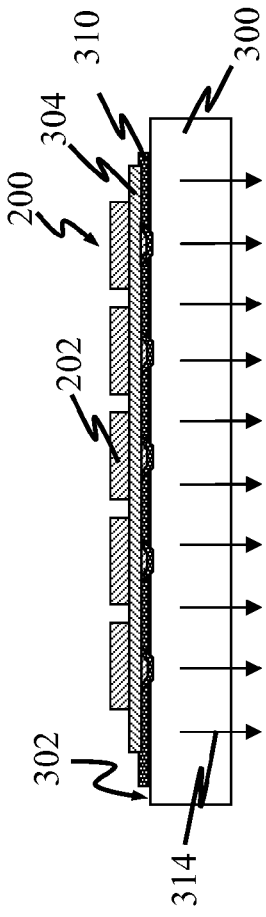

In a fourth example, the first semiconductor package 200 is secured to the surface 302 of the support table 300 by the lamination tape 310 of FIG. 3b and further by the vacuum suction 314 of FIG. 3d, as shown in FIG. 3e. In this way, the securing of the first semiconductor package 200 to the support table 300 is substantially enhanced.

Upon securing the first semiconductor package 200 to the support table 300, the method then involves the step 106 of reducing the thickness of the encapsulation layer 202 of the first semiconductor package 200.

Figure 4:
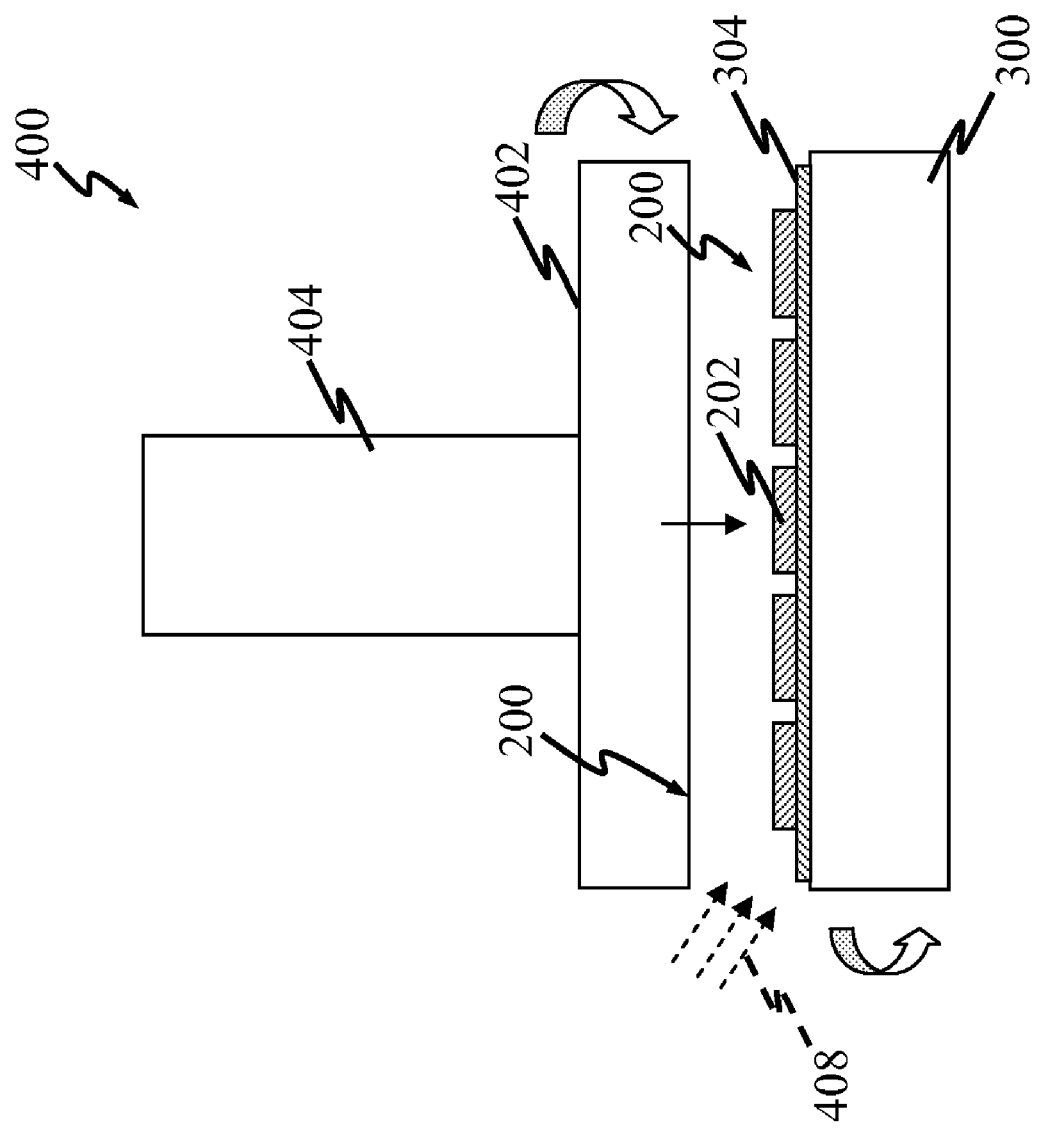
FIG. 4 shows a grinder for reducing the thickness of an encapsulation layer formed on the semiconductor package of FIGS. 3a to 3d.

A portion of the encapsulation layer 202 that is furthest away from the surface 302 of the support table 300 is removed, thereby reducing the thickness of the encapsulation layer 202. The portion of the encapsulation layer 202 is hereinafter known as a top portion. This is achieved by using a grinder 400 that comprises a grinding disc 402 as shown in FIG. 4. The grinding disc 402 rotates with respect to the support table 300 and is connected to a shaft 404. The shaft 404 is connected to a motor (not shown) for rotating the grinding disc 402. The grinding disc 402 is preferably rotated at a predetermined rotating speed, for instant 4500 rpm. The support table 300 is rotated in an opposite direction with respect to the grinding disc 402, preferably at a rotating speed of 100 rpm. The grinding disc 402 is moved slowly towards the support table 300 for engaging a plurality of the first semiconductor packages 200 that are secured to the support table 300.

The grinding disc 402 has a grinding surface 406 that is used to engage a process surface of the top portion of the encapsulation layer 202. Minute grinding structures are formed on the grinding surface 406 for gradual removal of the top portion. Fluid in the form of a stream of water jet 408 is preferably directed at the top portion of the encapsulation layer 202 during the step 106 of reducing the thickness of the encapsulation layer 202. This is to cool down the first semiconductor packages 200 so as to prevent the first semiconductor packages 200 from overheating, as well as to remove grinded waste material.

Alternatively, the temperature of the support table 300 is reduced during the grinding of the top portion of the encapsulation layer 202 for cooling down the first semiconductor packages 200.

After the top portion of the encapsulation layer 202 is removed, the thickness of the encapsulation layer 202 is reduced to a predetermined thickness. This results in the profile reduction of the first semiconductor packages 200. For instant, the encapsulation layer 202 has an original thickness of approximately 200 to 300 micrometers (µm). The original thickness is then reducible to approximately 10 to 15 µm after the step 106 of reducing the thickness of the encapsulation layer 202 is completed.

After the thickness of the encapsulation layer 202 is reduced to the predetermined thickness, the first semiconductor packages 200 are subjected to dehumidification in a drying chamber (not shown). The first semiconductor packages 200 are preferably dried for a period of 12 hours in the drying chamber. Specifically, the ambient air within the drying chamber preferably has a relative humidity of less than 15% and a temperature that is controllable to range between room temperature (20 to 23° C.) and 90° C.

Subsequently to the step 106 of reducing the thickness of the encapsulation layer 202, the full substrate panel or the several substrate panels are singulated to obtain individual semiconductor packages. Two or more of the individual semiconductor packages are then stacked together to form a multiple package structure in a POP configuration. For BGA packages and with reference to FIG. 2a, the solder balls 206 are attached to the substrate 208 either before or after the step 106 of reducing the thickness of the encapsulation layer 202. In the case of FDBGA packages and with reference to FIG. 2a, the solder balls 206 are attached to the substrate 208 after the step 106 of reducing the thickness of the encapsulation layer 202. This is because the step 106 is to be repeated for reducing the thickness of the mold cap 214 of the FDBGA packages. Solder balls 206 are therefore attached to the substrate 208 after the thickness of the mold cap 214 has been reduced to a predetermined thickness.

Figures 5A, 5B:
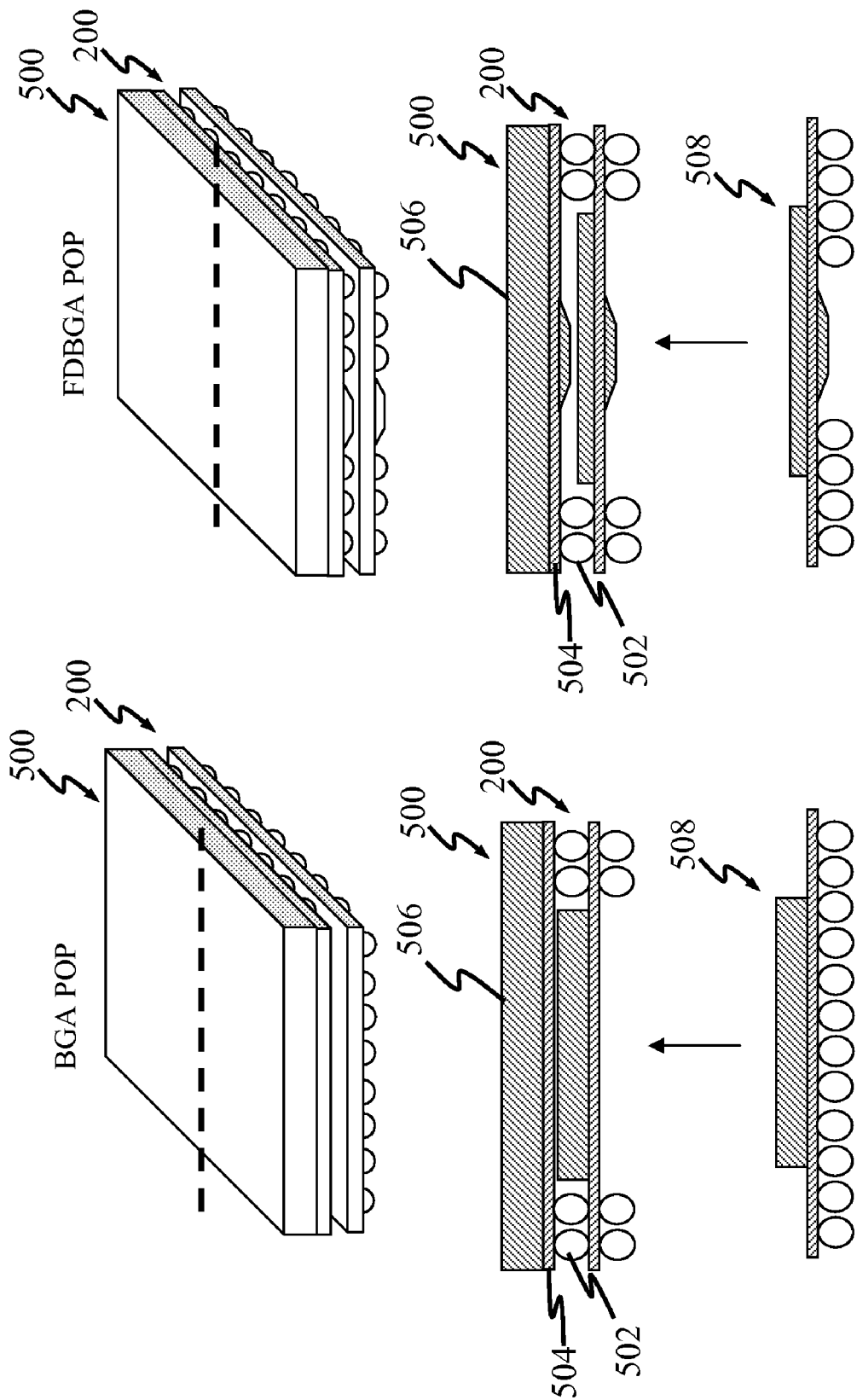
FIGS. 5a and 5b show a perspective and cross-sectional views of a BGA POP and a FDBGA POP.

FIGS. 5a and 5b show perspective and cross-sectional views of a BGA POP and a FDBGA POP. A second semiconductor package 500 is attached to the first semiconductor package 200 to form a corresponding BGA or FDBGA POP. In this case, the first semiconductor package 200 is also known as a bottom package of the BGA or FDBGA POP. Specifically, solder balls 502 of the second semiconductor package 500 are attached to substrates 208, 504 of both the first and second semiconductor packages 200, 500. The second semiconductor package 500 has an encapsulation layer 506 that has the original thickness.

Alternatively, the thickness of the encapsulation layer 506 of the second semiconductor package 500 is reduced in a way similar to that of the first semiconductor package 200. This is to further reduce the overall profile of the BGA or FDBGA POP. A clearance is maintained between the encapsulation layer 202 of the first semiconductor package 200 and the substrate 504 of the second semiconductor package 500 opposite to the encapsulation layer 202 of the first semiconductor package 200.

A third semiconductor package 508 is attachable to the POP to form a multiple POP structure. In particular, the third semiconductor package is attached to the first semiconductor package 200. The step 106 of reducing the thickness of the encapsulation layer 202 of the first semiconductor package 200 is used to reduce the profile of the third semiconductor package 508. The third semiconductor package 508 is attached to the first semiconductor package 200 in a similar way as the first semiconductor package 200 is attached to the second semiconductor package 500. Similarly, additional semiconductor packages are attachable to the multiple POP structure to form a larger POP structure.

Although only a number of embodiments of the invention are disclosed, it becomes apparent to one skilled in the art in view of this disclosure that numerous changes or modification can be made without departing from the scope and spirit of the invention. For example, although mechanical grinding is used to reduce the profile of the semiconductor packages in the forgoing embodiments, laser ablation process may be efficiently used if the grinder is substituted by a laser or the like.

The invention claimed is:

1. A method for forming a package-on-package structure, the method comprising:
   securing a first semiconductor package having at least one encapsulation layer formed on at least one side of the first semiconductor package to a surface of a support, the at least one encapsulation layer defining a first thickness, the surface being adapted for receiving the first semiconductor package;
   directing fluid onto a portion of the at least one encapsulation layer distal the surface; and
   reducing the first thickness of the at least one encapsulation layer to a second thickness by way of grinding the portion of the at least one encapsulation layer,
   wherein the first thickness of the at least one encapsulation layer is reduced for providing a clearance from a second semiconductor package attachable to the first semiconductor package, the clearance being the distance between the at least one encapsulation layer of the first semiconductor package and a side of the second semiconductor package opposing thereto.

2. The method of claim 1, further comprises attaching the second semiconductor package to the first semiconductor package for forming the package-on-package structure.

3. The method of claim 1, wherein grinding of the at least one encapsulation layer comprises using a grinder to remove the portion of the at least one encapsulation layer distal the surface.

4. The method of claim 1, wherein grinding of the at least one encapsulation layer comprises drying the first semiconductor package.

5. The method of claim 4, wherein drying the first semiconductor package comprises drying the first semiconductor package in a drying chamber.

6. The method of claim 5, wherein the first semiconductor package is dried for at least 24 hours.

7. The method of claim 5, wherein the first semiconductor package is dried in the chamber having a relative humidity of less than 15%.

8. The method of claim 5, wherein the first semiconductor package is dried in the chamber having a temperature between 20° C. and 90° C.

9. The method of claim 1, wherein securing the first semiconductor package to a surface comprises using a gripper to secure the first semiconductor package to the surface.

10. The method of claim 1, wherein securing the first semiconductor package to a surface comprises adhering the first semiconductor package to at least one lamination tape attached to the surface.

11. The method of claim 1, wherein securing the first semiconductor package to a surface comprises applying vacuum suction on the first semiconductor package via the surface.

12. The method of claim 11, wherein applying vacuum suction on the first semiconductor package via the surface comprises applying vacuum suction on one side of the first semiconductor package opposite the at least one encapsulation layer.

13. The method of claim 1, further comprises attaching solder balls to the first semiconductor package after reducing the thickness of the at least one encapsulation layer to a predetermined thickness.

14. The method of claim 1, further comprises attaching the first semiconductor package to the second semiconductor package.

15. The method of claim 1, further comprises attaching a third semiconductor package to the first semiconductor package.

16. The method of claim 1, wherein the first thickness is approximately 200 to 300 micrometers.

17. The method of claim 1, wherein the second thickness is approximately 10 to 15 micrometers.

* * * * *